(12) United States Patent
Stavrakos et al.

(10) Patent No.: US 8,312,172 B2
(45) Date of Patent: Nov. 13, 2012

(54) METHOD AND SYSTEM FOR DELTA COMPRESSION

(75) Inventors: Nicholas Stavrakos, Mountain View, CA (US); Jeff Monks, Sunnyvale, CA (US); Fred Koopmans, Menlo Park, CA (US); Chris Koopmans, Sunnyvale, CA (US); Kapil Dakhane, Sunnyvale, CA (US)

(73) Assignee: Bytemobile, Inc., Santa Clara, CA (US)

( * ) Notice: Subject to any disclaimer, the term of this patent is extended or adjusted under 35 U.S.C. 154(b) by 1199 days.

(21) Appl. No.: 11/439,068

(22) Filed: May 22, 2006

(65) Prior Publication Data

US 2006/0271559 A1   Nov. 30, 2006

Related U.S. Application Data

(60) Provisional application No. 60/685,260, filed on May 26, 2005.

(51) Int. Cl.
*G06F 15/16* (2006.01)
(52) U.S. Cl. ......... 709/247; 709/201; 709/203; 709/219
(58) Field of Classification Search .................. 709/247, 709/201, 203, 219; 707/10, 100
See application file for complete search history.

(56) References Cited

U.S. PATENT DOCUMENTS

| | | | |
|---|---|---|---|
| 6,636,872 B1 * | 10/2003 | Heath et al. ........................... | 1/1 |
| 6,757,717 B1 | 6/2004 | Goldstein | |
| 7,139,811 B2 * | 11/2006 | Lev Ran et al. ............... | 709/217 |
| 2002/0004813 A1 * | 1/2002 | Agrawal et al. ............... | 709/201 |
| 2002/0112032 A1 * | 8/2002 | Martin et al. ................. | 709/219 |
| 2002/0143892 A1 | 10/2002 | Mogul | |
| 2003/0004998 A1 * | 1/2003 | Datta ........................... | 707/513 |
| 2005/0117558 A1 | 6/2005 | Angermann et al. | |

OTHER PUBLICATIONS

Tridgell et al., The rsync algorithm, Jun. 1996, The Australian National University, TR-CS-96-05, pp. 1-6.*
International Search Report and Written Opinion of the International Searching Authority for International Application No. PCT/US2006/020199, mailed Jan. 16, 2007, 14 pages.
International Preliminary Report on Patentability for PCT/US2006/020199, mailed on Dec. 13, 2007.
Berners-Lee, T., et al., "RFC1945," http://rfc.net/rfc1945.html, The Internet Society (1996) pp. 1-57.
Fielding, R. et al., "RFC2616," http://rfc.net/rfc2616.html, The Internet Society (1999) pp. 1-165.
Kristol, D., et al., "RFC2965," http://rfc.net/rfc2965.html, The Internet Society (2000) pp. 1-25.
Kriston, D., et al., "RFC2109," http://rfc.net/rfc2109.html, The Internet Society (1997) pp. 1-21.
Mogul, J., et al., "RFC3229," http://rfc.net/rfc3229.html, The Internet Society (2002) pp. 1-46.

* cited by examiner

*Primary Examiner* — Peter Shaw
(74) *Attorney, Agent, or Firm* — Finnegan, Hederson, Farabow, Garrett & Dunner LLP

(57) ABSTRACT

A method and system for providing delta compression, the method includes receiving request data from a user agent, communicating with a content server, wherein the communication includes transmitting the request data to the content server and receiving response data associated with the request data, generating key data associated with the response data, wherein the generated key data represents block data of the response data, storing the generated key data and the block data, and transmitting the block data to the user agent.

13 Claims, 10 Drawing Sheets

METHOD AND SYSTEM FOR DELTA COMPRESSION

CROSS REFERENCE TO RELATED PATENTS

This application claims the benefit of U.S. Provisional Application No. 60/685,260, filed May 26, 2005, "Advanced Data Optimization." This provisional application is incorporated herein by reference.

BACKGROUND INFORMATION

The Internet allows for vast amounts of information to be communicated over any number of interconnected networks, computers, and network devices. Typically, information or content is located at websites on one or more servers, and a user can retrieve the content using a user agent, such as a web browser, running on a client device. For example, the user can input a webpage address into the web browser or access a web link, which sends requests to a server to access and provide the content on the respective website. This type of communication is commonly referred to as "web browsing."

As web pages have become more complex, a common website may contain hundreds of objects on its web pages. Such objects may include text, graphics, images, sound, etc. The web pages may also have objects located across multiple servers. That is, one server may provide dynamic content (e.g., content that remembers the last books ordered by a user) for a web page, whereas other servers may provide static but rotating content such as an advertisement, and still others provide the static content of the site. As such, before a user can view a web page, hundreds of objects may require downloading from multiple servers. Each server, however, may take a different amount of time to service a request for an object contributing to latency. Thus, the latency for each server may vary with different levels of magnitude, e.g., one server may respond in milliseconds whereas another server may respond in seconds.

When the World Wide Web was first introduced, much of the content was static. Now, a web page is typically accessed by downloading an HTML file that is pointed to by a URL. This file may reference many other objects, including scripts (e.g. JavaScript, Cascading Style Sheet), images (e.g. GIF, JPEG, PNG, BMP), and application content (e.g. Shockwave Flash, Java Applets). Because web pages have become more personalized and are updated more frequently, current caching models for HTTP begin to fail. Thus, the current cache models cannot efficiently handle these dynamic and unique web pages.

DESCRIPTION OF THE EMBODIMENTS

Reference will now be made in detail to the exemplary embodiments implemented according to the invention, the examples of which are illustrated in the accompanying drawings. Wherever possible, the same reference numbers will be used throughout the drawings to refer to the same or like parts.

Figure 1:
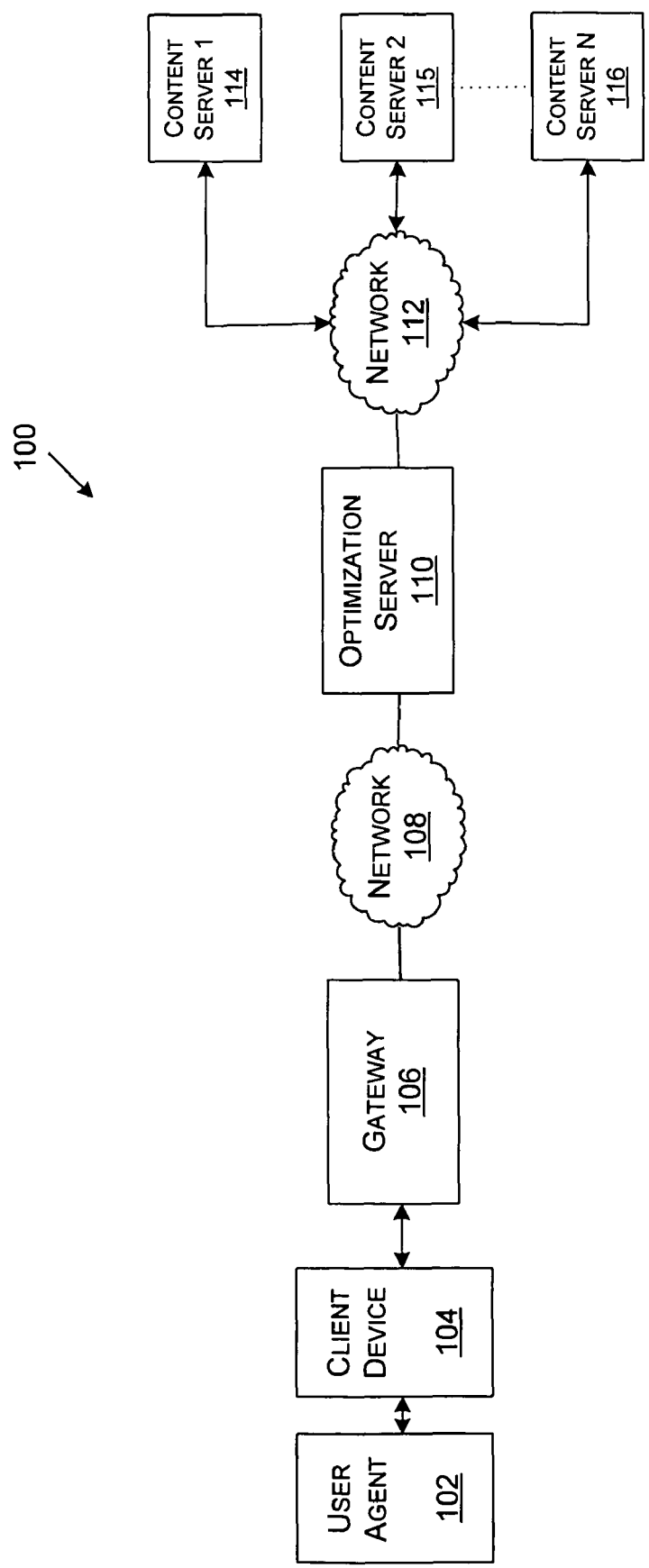
FIG. 1 is a block diagram of an exemplary system.

FIG. 1 is a block diagram of an exemplary system. Exemplary system 100 can be any type of system that transmits data over a network. For example, the exemplary system can include a user agent (e.g. a web browser) accessing information from content servers through the Internet. The exemplary system can include, among other things, a user agent 102, a client device 104, a gateway 106, one or more networks 108, 112, an optimization server 110, and one or more content servers 114-116.

User agent 102 is a client application used with a network protocol. For example, user agent 102 could be a web browser, a search engine crawler, a screen reader, or a Braille browser, and user agent 102 could be used to access the Internet. User agent 102 can be a software program that transmits requests to a web server and receives responses to those requests. For example, user agent 102 can send a request to the content servers 114-116 for a particular file or object of a web page, and the content server of the web page can query the object in a database and can send back the object as part of a response to the user agent. This process continues until every object in the web page has been downloaded to the user agent.

Client device 104 is a computer program or terminal that can access remote services. Client device 104 can receive a Uniform Resource Locator (URL) request from user agent 102, can transmit the request to the content servers, and can receive a response to the request. For example, client device 104 can be Bytemobile Optimization Client Software. Client device's 104 functionality is further described below.

Gateway 106 is a device that converts formatted data provided in one type of network to a particular format required for another type of network. Gateway 106, for example, may be a server, a router, a firewall server, a host, or a proxy server. The gateway 106 has the ability to transform the signals received from client device 104 into a signal that network 108 can understand and vice versa. Gateway 106 may be capable of processing audio, video, and T.120 transmissions alone or in any combination, and is capable of full duplex media translations.

Networks 108 and 112 can include any combination of wide area networks (WANs), local area networks (LANs), or wireless networks suitable for networking communication such as Internet communication.

Optimization server 110 is a server that provides communication between the gateway 106 and the content servers 114-116. For example, optimization server could be a Bytemobile Optimization Services Node. Optimization server 110 optimizes performance to enable significantly faster and more reliable service to customers. Optimization server's 110 optimization techniques are further described below.

Content servers 114-116 are servers that receive the requests from user agent 102 and return the requests back to user agent 102. For example, content servers 114-116 can be a web server, an enterprise server, or any other type of server. Content servers 114-116 can be a computer or a computer program that is responsible for accepting HTTP requests from the user agent and serving the user agents with web pages.

Figure 2:
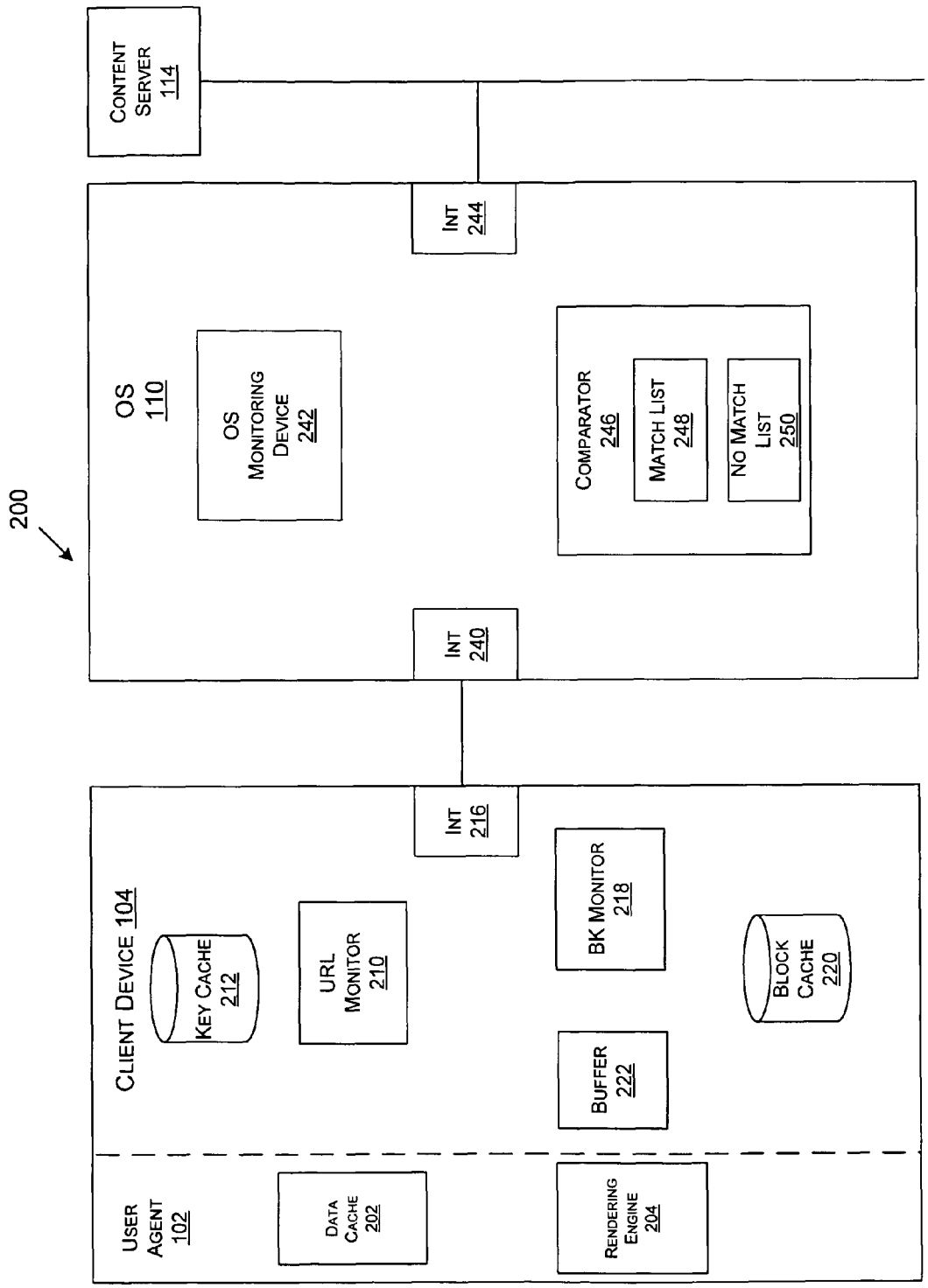
FIG. 2 is a block diagram illustrating an embodiment of the exemplary system of FIG. 1.

FIG. 2 is a block diagram illustrating an embodiment of the exemplary system of FIG. 1. User agent 102 may include, among other things, a data cache 202 and a rendering engine 204.

Data cache 202 is a storage device that stores web documents to reduce bandwidth usage for web page access times. Data cache 202 stores content data, which is made up of block data, requested and received by the user. Subsequent web page requests may be satisfied by accessing data cache 202 if certain conditions are met. Such conditions may include whether the content data is stored in data cache 202 and whether the stored content data is deemed fresh or stale. For example, the freshness of the stored content data can be defined by the definition of 'fresh' and 'stale' in RFC 1945 and RFC 2616.

Rendering engine 204 can be a software application that enables a user agent to display and interact with text, images, and other information located on a webpage. When a user types in a web address or URL into rendering engine 204, rendering engine 204 uses Hypertext Transfer Protocol (HTTP) to initiate the request with the content server, e.g. content server 114. Although rendering engines can be used to access the Internet, they can also be used to access data provided by web servers in private networks or content in file systems.

Client device 104 may include, among other things, a URL monitor 210, a key cache 212, an interface 216, a block and key monitor 218, a block cache 220, and a buffer 222.

URL monitor 210 can be a software program or a hardware device that intercepts the request, such as an HTTP request, from rendering engine 204. URL monitor 210 can extract the URL from the request and can request key data associated with the URL from the key cache 212. In some embodiments, when the key cache 212 does not have key data related to the extracted URL, URL monitor 210 can query data cache 202 for any stored content data related to the URL. The stored content data can include, among other things, block data referencing the URL, the URL prefix, and the domain name. URL monitor 210 can perform an algorithm, such as a checksum or an MD5 hash, that generates client key data, which describes the sequence of bytes in the received block data, which can be stored in block cache 220 for future referencing. In some embodiments, key cache 212 can request data cache 202 for the content data and provide the key data to URL monitor 210. For example, URL monitor may request key data based on the URL, a URL-prefix, and a domain name of the URL. After URL monitor 210 receives client key data from key cache 212, URL monitor 210 can forward the request along with any received client key data through the interface 216 to the optimization server 110.

Key cache 212 is a data storage device that receives the request associated with the URL from URL monitor 210. Key cache 212 stores client key data that describes or represents larger block data referencing the URL, the URL prefix, and the domain name. For example, key data may be a hash value for the block data. Based on the request associated with the URL, the key cache returns any relevant client key data. If the key cache does not include any key data, the request can be sent to the content server for processing without delta compression. In some embodiments, when key cache 212 does not include the relevant key data, key cache 212 can request data from data cache 202.

Interface 216 is a software program or a hardware device that communicatively couples client device 104 to the communication means (e.g. wireless and/or wired) connecting client device 104 and optimization server 110. Interface 216 is configured to receive the request from the URL monitor, translate the request, and transmit the translated request to the optimization server 110. Further, interface 216 is configured to receive information from the communication means connecting client device 104 and optimization server 110. In some embodiments, the interface can include encryption means and/or decryption means to encrypt communication leaving from and decrypt communication coming into client device 104.

Block and key (BK) monitor 218 is a software program or a hardware device that can be communicatively coupled with optimization server 110, block cache 220, and buffer 222. In some embodiments, based on the type of data, BK monitor 218 can provide information to buffer 222, block cache 220, and/or key cache 212. In some embodiments, BK monitor 218 may include a hash function.

Block cache 220 is a data storage device that stores block data. Block cache 220 can be communicatively coupled to BK monitor 218, buffer 222, and interface 216, which is communicatively coupled to comparator 246 of the optimization server 110.

Buffer 222 is a software program or a hardware device that temporarily stores block data to help compensate for differences in the transfer rate of block data from BK monitor 218 and/or block cache 220 to rendering engine 204 at user agent 102. In some embodiments, buffer can receive block data from comparator 246 located at the optimization server 110. Once buffer 222 has the block data of the response from content servers 114-116, buffer 222 can transmit the sequence of block data to rendering engine 204.

Optimization server (OS) 110 may include, among other things, a plurality of interfaces 240 and 244, an OS monitoring device 242, and comparator 246, which may further include a match list 248 and a no match list 250.

Interfaces 240 and 244 are similar to interface 216 of client device 104. Each interface has the ability to communicate with the elements of the optimization server, translate the communication so that the communication means can utilize the data, and transmit the translated communication across the corresponding communication means. Like interface 216, interfaces 240 and 244 may have encryption and decryption means.

OS monitoring device 242 is a software program or a hardware device that monitors the request received through the interface 240 from client device 104. In some embodiments, the request may include key data appended to the original request. When OS monitoring device 242 receives the request and key data appended to the request, OS monitoring device 242 can extract the original request from the key data and transmit the original request through interface 244 to content server 114. OS monitoring device 242 can transmit the "left over" key data to comparator 246.

Comparator 246 is a software program or a hardware device that receives a response through interface 244 from content server 114 and generates a set of keys corresponding to the response via a block encoding method, which is further described below in connection with FIG. 4. These generated keys and the key data received from OS monitoring device 242 are compared by the block matching method, which is further described with reference to FIG. 5. If there is a match, the client key data that matches the new key data associated with block data from the response is logged at the match list 248. If there is not a match, the block data from the response is logged in the no match data list 250. In some embodiments, match list 248 and no match list 250 can be any type of storage device such as a list, an array, a data structure, a database, a cache, a buffer, etc. In some embodiments, comparator 246 may not include the match or no match lists 248, 250 and may transmit the information to the client device immediately after the comparison has been determined. After the comparison, comparator 246 can transmit the relevant key data and block data through the interface 240 to client device 104.

Figure 3A:
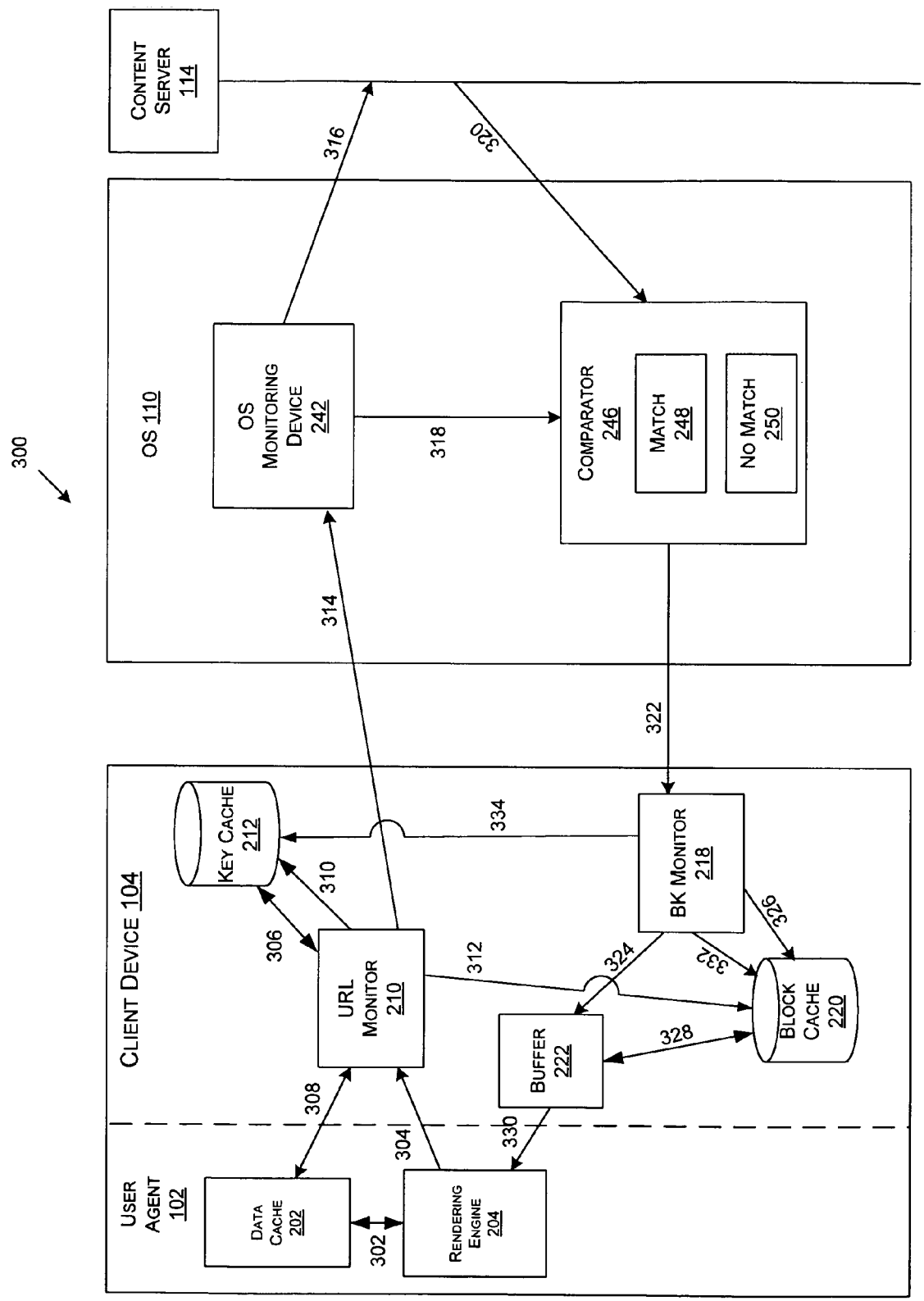
FIGS. 3A & 3B are functional diagrams illustrating exemplary communication flows for the exemplary system of FIG. 2.

FIG. 3A is a functional diagram illustrating an exemplary communication flow in the system of FIG. 2. It is assumed for the purposes of explaining this exemplary communication flow that data cache 202 has stored content data related to the request data from user agent 102 and that key cache 212 does not have key data related to the request data. In addition, while a single content server 114 has been displayed for simplicity purposes, any number of content servers could be provided. A user inputs a URL into a rendering engine 204 of a user agent 102. Rendering engine 204 queries (302) data cache 202 for any content data relating to the URL and data cache 202 determines that at least some of the content data is stale. User agent 102 transmits (304) the request data to URL monitor 210 of client device 104. In some embodiments, URL monitor 210 can be located within user agent 102.

After rendering engine 204 transmits the request, URL monitor 210 of the client device 210 intercepts the request and extracts the URL from the request. Once URL monitor 210 has extracted the URL, URL monitor queries (306) key cache for any key data. In some embodiments, key cache 212 looks for key data relating to the URL first, and if key data relating to the URL is not located, the key cache can look for any key data relating to the URL prefix of the URL. Correspondingly, if key data of the URL prefix is not located, the key cache can look for any key data relating to the domain name of the URL. The more relevant the key data is to the extracted URL, the more likely the key data could be matched at comparator 246 of OS 110. In this exemplary embodiment, key cache does not have the key data associated with the request data and URL monitor 210 can query (308) data cache for any content data. In this exemplary embodiment, the content data is determined to be stale and the data cache 202 can return this stale content data where the URL monitor 210 can break down the content data into block data. URL monitor 210 can perform an algorithm, such as a checksum or an MD5 hash, that generates client key data C1-CN, which describes the sequence of bytes in the received block data. URL monitor 210 provides (310) the client key data to key cache 212 for storage. Further, URL monitor provides (312) the corresponding block data to block cache 220 for storage. In some embodiments, if no block data is found relating to the URL, the URL prefix, or the domain name, URL monitor 210 can forward the request to content server 114.

After URL monitor 210 has been provided the client key data C1-CN, URL monitor 210 has the ability to append the relevant client key data to the request. URL monitor 210 can transmit (314) the original request and the appended client key data to OS monitoring device 242 at OS 110. In some embodiments, the request and the key data can be transmitted separately to OS 110.

After OS monitoring device 242 receives the request and the relevant key data, OS monitoring device 242 can extract the request, if necessary, from the client key data if any exists and can forward (316) the extracted request to content server 114. Further, OS monitoring device 242 can forward (318) the client key data C1-CN to a comparator 246 if any client key data exists. Once the content server receives the response from OS monitoring device 242, the content server accumulates any necessary information and provides (320) a corresponding response back to comparator 246 of OS 110.

After comparator 246 receives the response, the comparator generates new key data via a block encoding method. For example, block encoding method can be the exemplary block encoding method illustrated in FIG. 4. The exemplary block encoding method 400 computes new key data K1-KN that describes an object 410 of the response. The object 410 can be broken into fixed size blocks B1-BN starting at offset zero. These fixed size blocks B1-BN can be any size. In some embodiments, it may be advantageous to break down the fixed size blocks B1-BN into smaller sizes, such as 1 Kilobyte, so that blocks with matching keys would have a very small probability of not being identical. Additionally, the time and resources required to generate and match keys would not significantly impact capacity.

An algorithm, such as a checksum or a MD5 hash, can be used to generate new key data K1-KN, which describes the sequence of bytes in the block data B1-BN. In some embodiments, the portion of object that is left over after BN can be assigned to block B(N+1) that corresponds to new key data K(N+1). Further, in some embodiments, the last block BN may be variable in size to encompass this portion of the object. Alternatively, in some embodiments, this portion may not have a corresponding key.

Because client key data exists, comparator 246 performs the block encoding method along with a block matching method. For example, block matching method can be the exemplary block matching method illustrated in FIG. 5. The exemplary block matching method 500 matches new key data K1, provided in the block encoding method 400, with client key data C1. If there is not a match between K1 and C1, the block matching method shifts the block by a particular length, e.g. 1 byte, and generates new key data K2 to determine if there is a match with first client key data C1. The block matching method 500 continues through the object 410 of the request until a match between client key data C1 and any new key data K1-KN occurs or the end of the object 410 is reached without matching the first client key data C1. If the first client key data C1 does not match any new key data K1-KN derived from the block data B1-BN, the block matching method 500 performs the same matching process with the remaining client keys C2-CN. When a match is found, the client key data matching the new key data (C1=KJ) can be added to match list 248 and the block data BJ corresponding to matched key data KJ is deleted. Then, the next client key data C2 is checked starting from the end of the first match block (the block after the block corresponding to key KJ; matched offset+block size). If any new key data K1-KN does not match the client key data C1-CN, the block data corresponding to the unmatched new key data is added to the no match list 250.

Returning to FIG. 3A, once comparator 246 has performed some analysis concerning the block encoding method and the block matching method regarding the response, comparator can transmit (322) optimized data to BK monitor 218 of client device 104 in a single transmission or over a series of transmissions. The optimized data can include key data from the match list 248 and/or block data from the no match list 250. In some embodiments, the optimized data can include the non-matched new key data. Optimized data provides block data by supplying the non-matching block data to the buffer and by providing matched key data that makes stored block data available to the buffer. BK monitor 218 extracts the non-matching block data, copies the non-matching block data, and transmits (324) a copy of the non-matching block data to buffer 222.

BK monitor 218 transmits (326) the matching client key data to block cache 220. Consequently, block cache 220 can lookup the previously stored block data corresponding to the matching client keys. Block cache 220 can insert (328) this stored block data into buffer 222. In some embodiments, block cache 220 can return the stored block data to BK monitor 218 and BK monitor provides the stored block data to buffer 222. Buffer 222 has the ability to organize the stored block data from block cache and the non-matching block data before submitting (330) the complete block data to rendering engine 204 at user agent 102. In some embodiments, where buffer 222 is relatively dumb, BK monitor 218 has the ability to organize the stored block data from block cache and the non-matching block data before providing the organized block data to buffer 222. In some embodiments, the transmission step 326 and the insertion step 328 can precede the transmission step 324.

Figure 4:
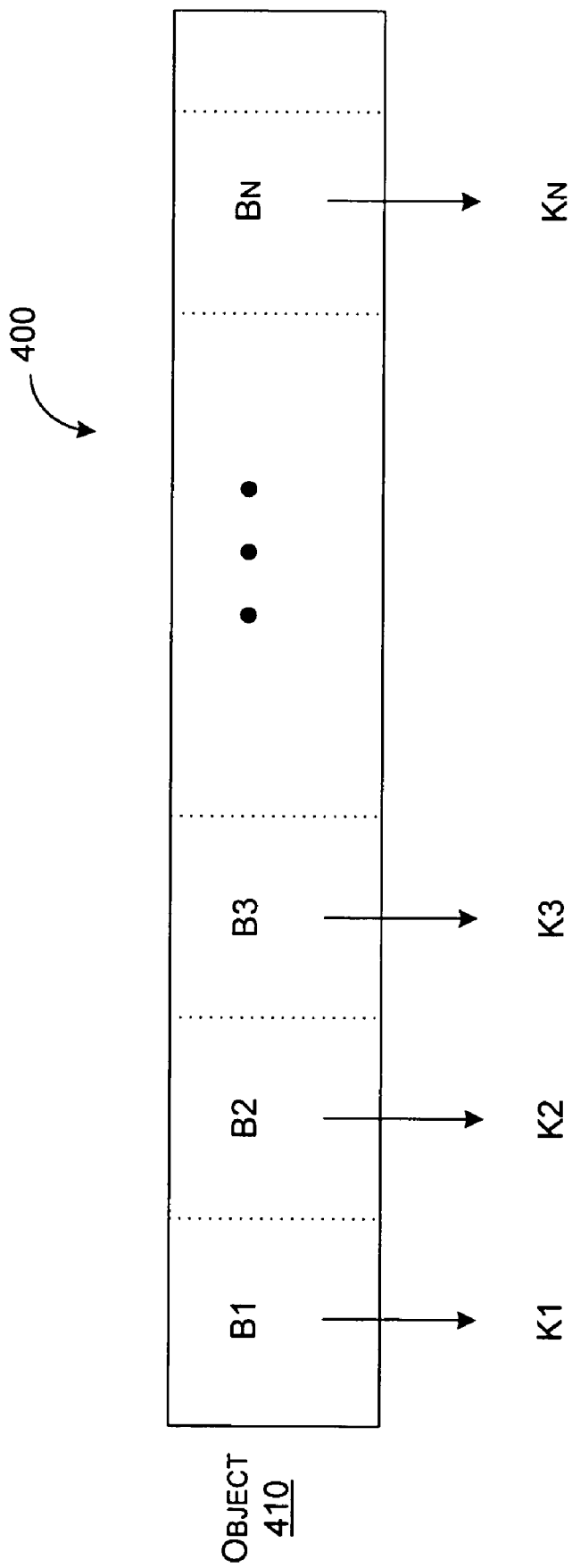
FIG. 4 is a diagram illustrating an exemplary block encoding method.
Figure 5:
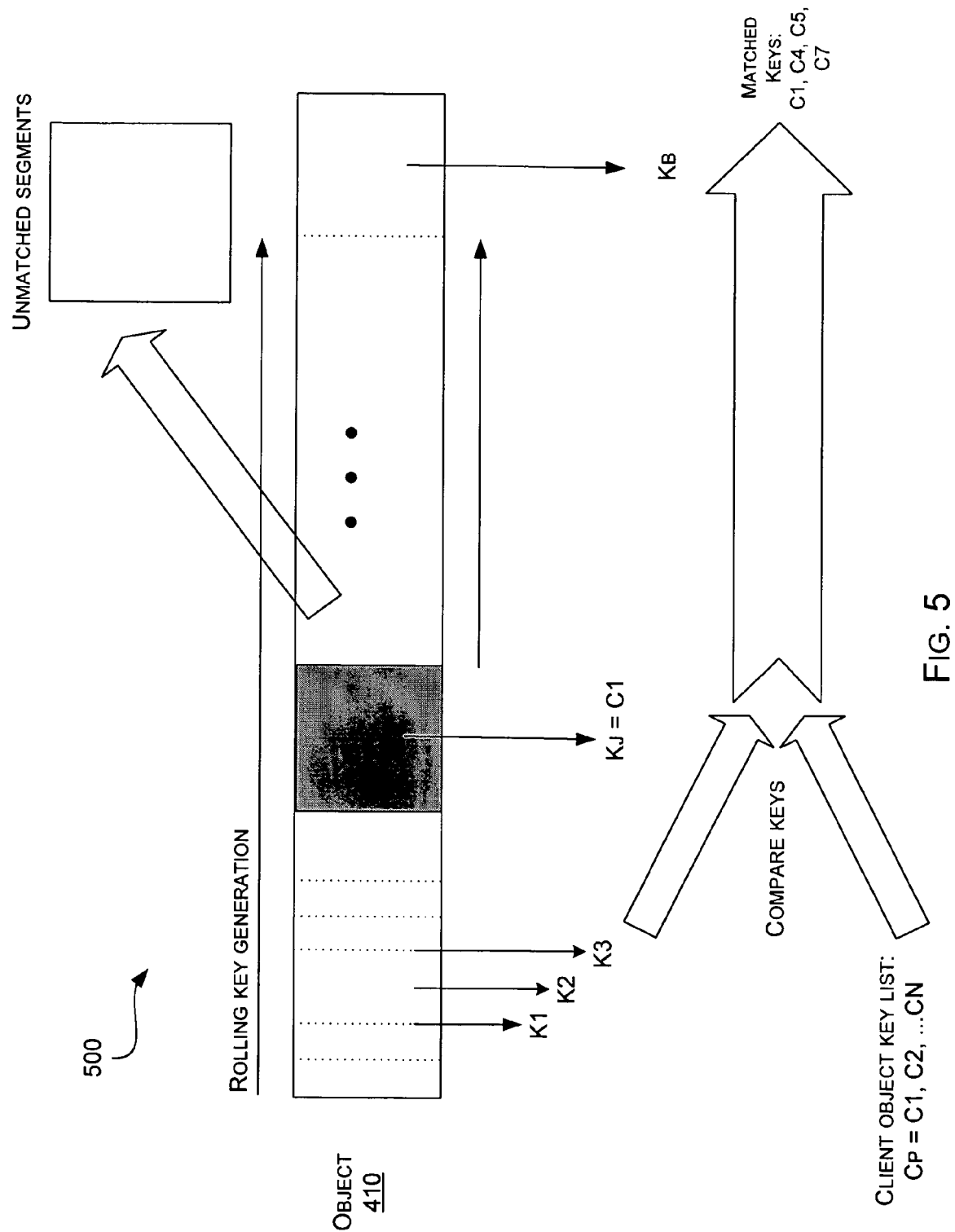
FIG. 5 is a diagram illustrating an exemplary block matching method.

BK monitor 218 can include a similar block encoding method described in FIG. 4. BK monitor 218 can generate new client key data representing or describing the received non-match block data and this new client key data matches or is similar to the new key data generated in OS 110. Alternatively, in some embodiments, BK monitor 218 may receive the non-matched new key data from OS 110 and then BK monitor 218 does not have to generate the new client key data. After the BK monitor has generated new client key data, BK monitor 218 can then store (332) a copy of the non-matching block data in block cache 220 for future referencing by user agent 102. BK monitor 218 can also transmit (334) the new client key data (or non-matching key data) to key cache 212 to be stored for future referencing by user agent 102. This stored new client key data or non-match key data can act as client key data in future requests from the user agent. In some embodiments, transmission step 334 can precede insertion step 332. Further, in some embodiments, insertion step 332 and transmission step 334 can precede submitting step 330.

Figure 3B:
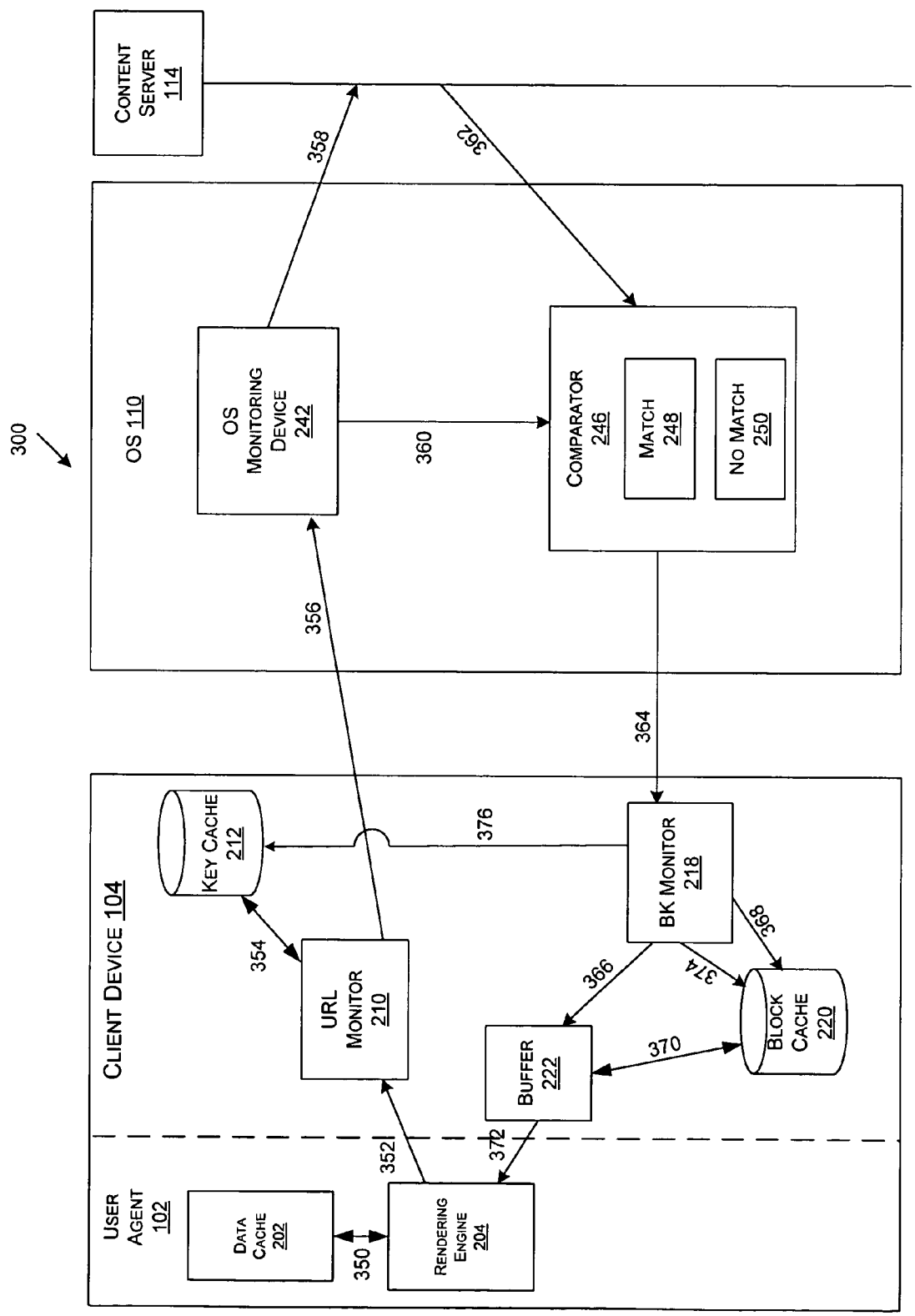

FIG. 3B is a functional diagram illustrating an exemplary communication flow in the system of FIG. 2. It is assumed for the purposes of explaining this exemplary communication flow that key cache 202 has stored key data related to the request data from user agent 102. In addition, while a single content server 114 has been displayed for simplicity purposes, any number of content servers could be provided. A user inputs a URL into a rendering engine 204 of a user agent 102. Rendering engine 204 queries (350) data cache 202 for any content data relating to the URL and data cache 202 determines that no relevant content data exists or that at least some of the content data is stale. User agent 102 transmits (352) the request data to URL monitor 210 of client device 104. In some embodiments, URL monitor 210 can be located within user agent 102.

After rendering engine 204 transmits the request, URL monitor 210 of the client device 210 intercepts the request and extracts the URL from the request. Once URL monitor 210 has extracted the URL, URL monitor queries (354) key cache for any key data. In some embodiments, key cache 212 looks for key data relating to the URL first, and if key data relating to the URL is not located, the key cache can look for any key data relating to the URL prefix of the URL. Correspondingly, if key data of the URL prefix is not located, the key cache can look for any key data relating to the domain name of the URL. The more relevant the key data is to the extracted URL, the more likely the key data could be matched at comparator 246 of OS 110. In this particular exemplary embodiment, the key cache returns client key data C1-CN. In some embodiments, if no block data is found relating to the URL, the URL prefix, or the domain name, URL monitor 210 can forward the request to content server 114.

After URL monitor 210 has been provided the client key data C1-CN, URL monitor 210 has the ability to append the relevant client key data to the request. URL monitor 210 can transmit (356) the original request and the appended client key data to OS monitoring device 242 at OS 110. In some embodiments, the request and the key data can be transmitted separately to OS 110.

After OS monitoring device 242 receives the request and the relevant key data, OS monitoring device 242 can extract the request, if necessary, from the client key data if any exists and can forward (358) the extracted request to content server 114. Further, OS monitoring device 242 can forward (360) the client key data C1-CN to a comparator 246 if any client key data exists. Once the content server receives the response from OS monitoring device 242, the content server accumulates any necessary information and provides (362) a corresponding response back to comparator 246 of OS 110.

After comparator 246 receives the response, the comparator generates new key data via a block encoding method. For example, block encoding method can be the exemplary block encoding method illustrated in FIG. 4. The exemplary block encoding method 400 computes new key data K1-KN that describes an object 410 of the response. The object 410 can be broken into fixed size blocks B1-BN starting at offset zero. These fixed size blocks B1-BN can be any size. In some embodiments, it may be advantageous to break down the fixed size blocks B1-BN into smaller sizes, such as 1 Kilobyte, so that blocks with matching keys would have a very small probability of not being identical. Additionally, the time and resources required to generate and match keys would not significantly impact capacity.

An algorithm, such as a checksum or a MD5 hash, can be used to generate new key data K1-KN, which describes the sequence of bytes in the block data B1-BN. In some embodiments, the portion of object that is left over after BN can be assigned to block B(N+1) that corresponds to new key data K(N+1). Further, in some embodiments, the last block BN may be variable in size to encompass this portion of the object. Alternatively, in some embodiments, this portion may not have a corresponding key.

Because client key data exists, comparator 246 performs the block encoding method along with a block matching method. For example, block matching method can be the exemplary block matching method illustrated in FIG. 5. The exemplary block matching method 500 matches new key data K1, provided in the block encoding method 400, with client key data C1. If there is not a match between K1 and C1, the block matching method shifts the block by a particular length, e.g. 1 byte, and generates new key data K2 to determine if there is a match with first client key data C1. The block matching method 500 continues through the object 410 of the request until a match between client key data C1 and any new key data K1-KN occurs or the end of the object 410 is reached without matching the first client key data C1. If the first client key data C1 does not match any new key data K1-KN derived from the block data B1-BN, the block matching method 500 performs the same matching process with the remaining client keys C2-CN. When a match is found, the client key data matching the new key data (C1=KJ) can be added to match list 248 and the block data BJ corresponding to matched key data KJ is deleted. Then, the next client key data C2 is checked starting from the end of the first match block (the block after the block corresponding to key KJ; matched offset+block size). If any new key data K1-KN does not match the client key data C1-CN, the block data corresponding to the unmatched new key data is added to the no match list 250.

Returning to FIG. 3B, once comparator 246 has performed some analysis concerning the block encoding method and the block matching method regarding the response, comparator can transmit (364) optimized data to BK monitor 218 of client device 104 in a single transmission or over a series of transmissions. The optimized data can include key data from the match list 248 and/or block data from the no match list 250. In some embodiments, the optimized data can include the non-matched new key data. Optimized data provides block data by supplying the non-matching block data to the buffer and by providing matched key data that makes stored block data available to the buffer. BK monitor 218 extracts the non-matching block data, copies the non-matching block data, and transmits (366) a copy of the non-matching block data to buffer 222.

BK monitor 218 transmits (368) the matching client key data to block cache 220. Consequently, block cache 220 can lookup the previously stored block data corresponding to the matching client keys. Block cache 220 can insert (370) this stored block data into buffer 222. In some embodiments, block cache 220 can return the stored block data to BK monitor 218 and BK monitor provides the stored block data to buffer 222. Buffer 222 has the ability to organize the stored block data from block cache and the non-matching block data before submitting (372) the complete block data to rendering engine 204 at user agent 102. In some embodiments, where buffer 222 is relatively dumb, BK monitor 218 has the ability to organize the stored block data from block cache and the non-matching block data before providing the organized block data to buffer 222. In some embodiments, the transmission step 368 and the insertion step 370 can precede the transmission step 366.

BK monitor 218 can include a similar block encoding method described in FIG. 4. BK monitor 218 can generate new client key data representing or describing the received non-match block data and this new client key data matches or is similar to the new key data generated in OS 110. Alternatively, in some embodiments, BK monitor 218 may receive the non-matched new key data from OS 110 and then BK monitor 218 does not have to generate the new client key data. After the BK monitor has generated new client key data, BK monitor 218 can then store (374) a copy of the non-matching block data in block cache 220 for future referencing by user agent 102. BK monitor 218 can also transmit (376) the new client key data (or non-matching key data) to key cache 212 to be stored for future referencing by user agent 102. This stored new client key data or non-match key data can act as client key data in future requests from the user agent. In some embodiments, transmission step 376 can precede insertion step 370. Further, in some embodiments, insertion step 370 and transmission step 376 can precede submitting step 372.

Figure 6A:
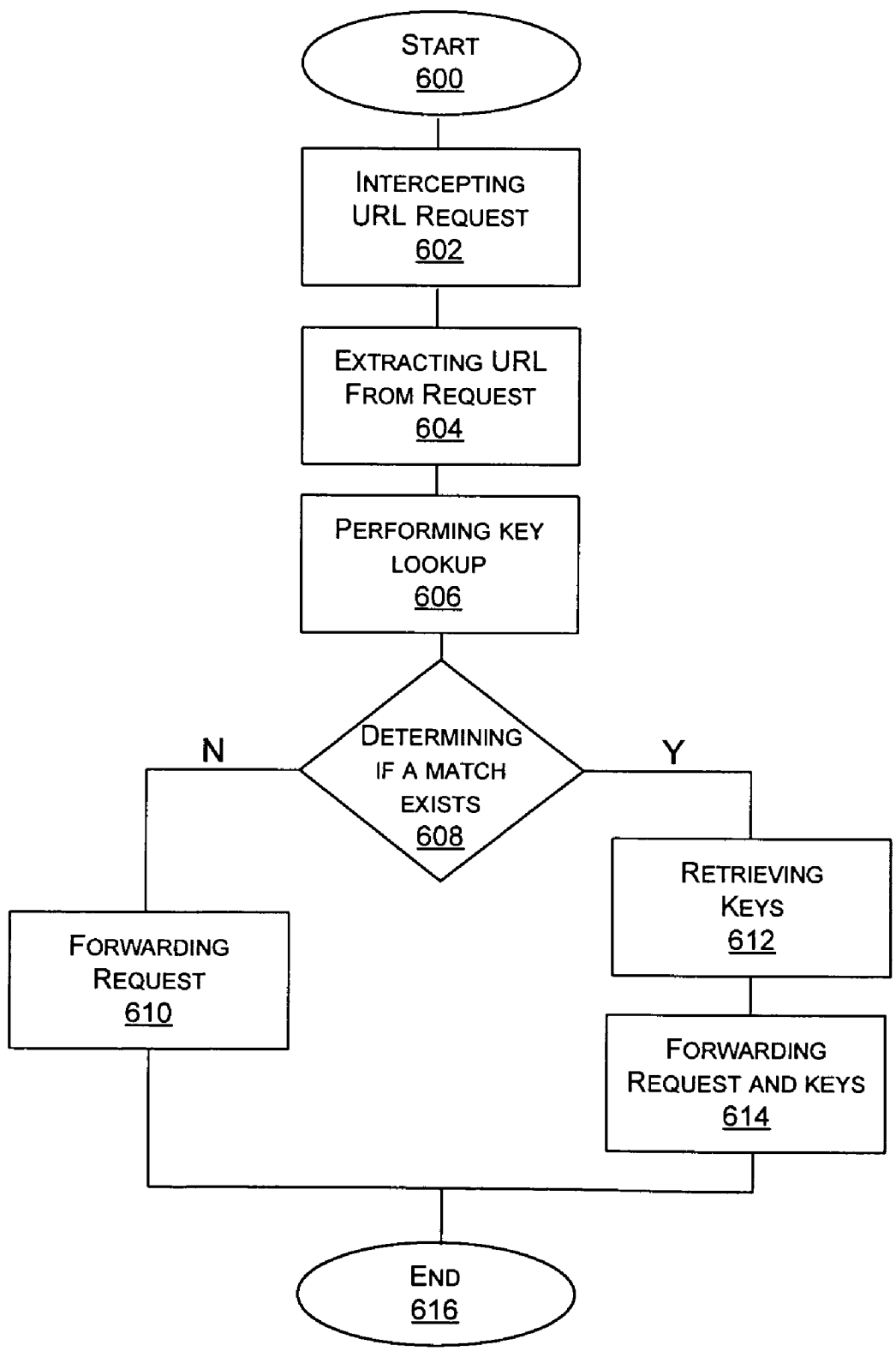
FIGS. 6A & 6B are flowcharts representing exemplary methods for providing delta compression at a user agent and client device.
Figure 6B:
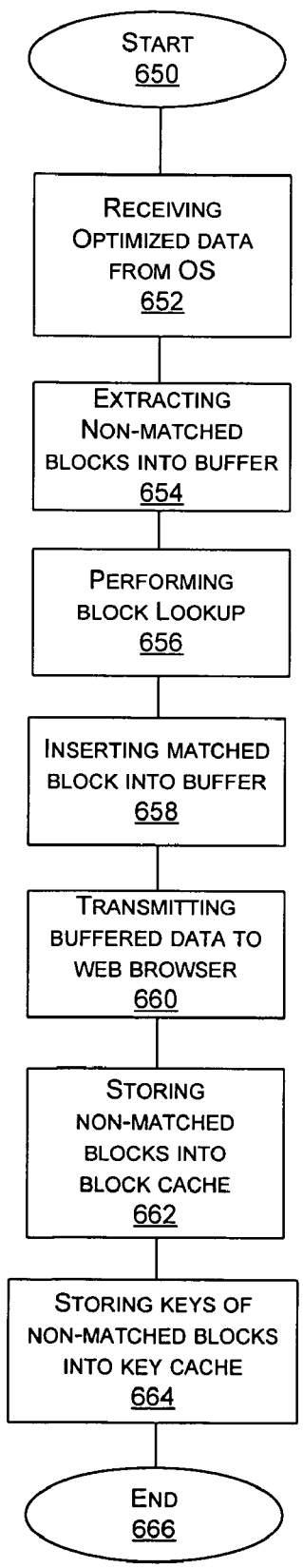

FIGS. 6A and 6B are flowcharts representing exemplary methods for providing delta compression at a client device. Referring to FIG. 6A, it will be readily appreciated by one of ordinary skill in the art that the illustrated procedure can be altered to delete steps or further include additional steps. After initial start step 600, a client device can intercept (602) a request and can extract (604) a URL from the request. In some embodiments, the request is an HTTP request.

After the client device extracts the URL from the request, the client device can perform (606) a key lookup corresponding to the extracted URL. Client key data can be stored in a key data storage, such as a cache, a database etc. If the key lookup does not produce any client key data, the client device can further access a data cache at a user agent to determine if any corresponding content data relates to the requested URL. If so, the data cache can return block data of the content data and the client device can generate key data, as described above, based on the return block data, and store this key data in the key data storage and this block data in a block data storage, such as block cache 220. The key lookup provides any existing client key data relating to the URL, a URL prefix of the URL, and/or a domain name of the URL. In some embodiments, the key lookup filters the key data for the key data relating to the URL first and if key data relating to the URL is not located, the key lookup filters the key data relating to the URL prefix of the URL. Correspondingly, if key data of the URL prefix is not located, the key lookup can look for key data relating to the domain name of the URL.

Based on the URL and the stored key data, the client device determines (608) if a match exists between the URL and any stored client key data. If a match does not exist, the client device can forward (610) the request to either an OS or a content server. On the other hand, if a match does exist, the client device can retrieve (612) any client key data if it exists and then forward (614) the request and the client key data to the optimization server for processing. In some embodiments, the client key data is appended onto the request. Alternatively, in some embodiments, the client key data and the request can be sent in separate transmissions to the OS. After either forwarding step 610 or 614, the method can end (616).

Referring to FIG. 6B, it will be readily appreciated by one of ordinary skill in the art that the illustrated procedure can be altered to delete steps or further include additional steps. After initial start step 650, a client device can receive (652) a response from an OS. Optimized data can include client key data from the request and/or non-matched block data processed at the OS. In some embodiments, optimized data can include new key data from the OS. For example, the optimized data can include the client key data that is the client key data from step 612 in FIG. 6A, and/or the non-matched block data being the non-matched block data logged in step 764 in FIG. 7B.

After the client device has received the optimized data, the client device can extract (654) the non-matched block data into a buffer. In some embodiments, the non-matched block data is copied before extracting the block data into buffer. Alternatively, in some embodiments, step 654 can be deleted when non-matched block data was not included in the optimized data. Further, client device can perform (656) a block lookup using the client key data from the response. The client key data provides a reference to previously stored block data (matched block data) in a block storage device, e.g. block cache 220. Alternatively, in some embodiments, step 656 can be deleted client key data is not included in the optimized data. Furthermore, in some embodiments performing step 656 can precede the extracting step 654. The matched block data can be inserted (658) into the buffer. After the buffer has received the matched and/or non-matched block data, the buffer can organize the block data and transmit (660) the buffered data to a user agent.

At this time, the client device can store (662) the non-matched block data into the block storage device for future referencing. Additionally, client device can store (664) the key data relating to the non-matched key data in a key data storage for future referencing. For example, the key data relating to the non-matched key data can be new client key data or the non-matched new key data; and the key data storage can be key cache 212 in FIG. 2 or key data storage provided in FIG. 6A. In some embodiments, storage steps 662 and 664 can be inner-switched. In some embodiments, storage steps 662 and 664 can be placed at any point after receiving step 652. In this exemplary embodiment, after storing step 664, the method can end (666).

Figure 7A:
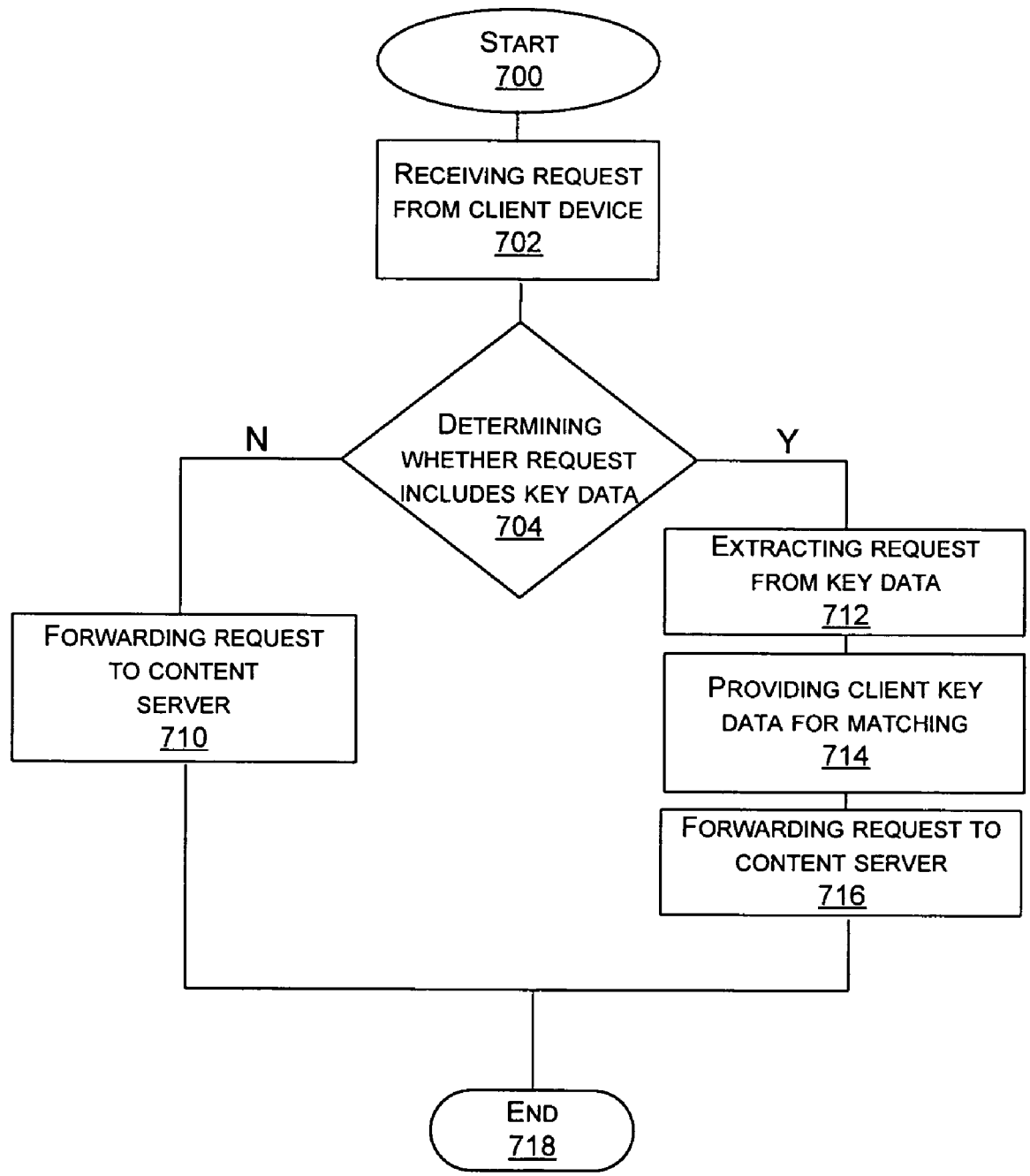
FIGS. 7A & 7B are flowcharts representing exemplary methods for providing delta compression at an optimization server.
Figure 7B:
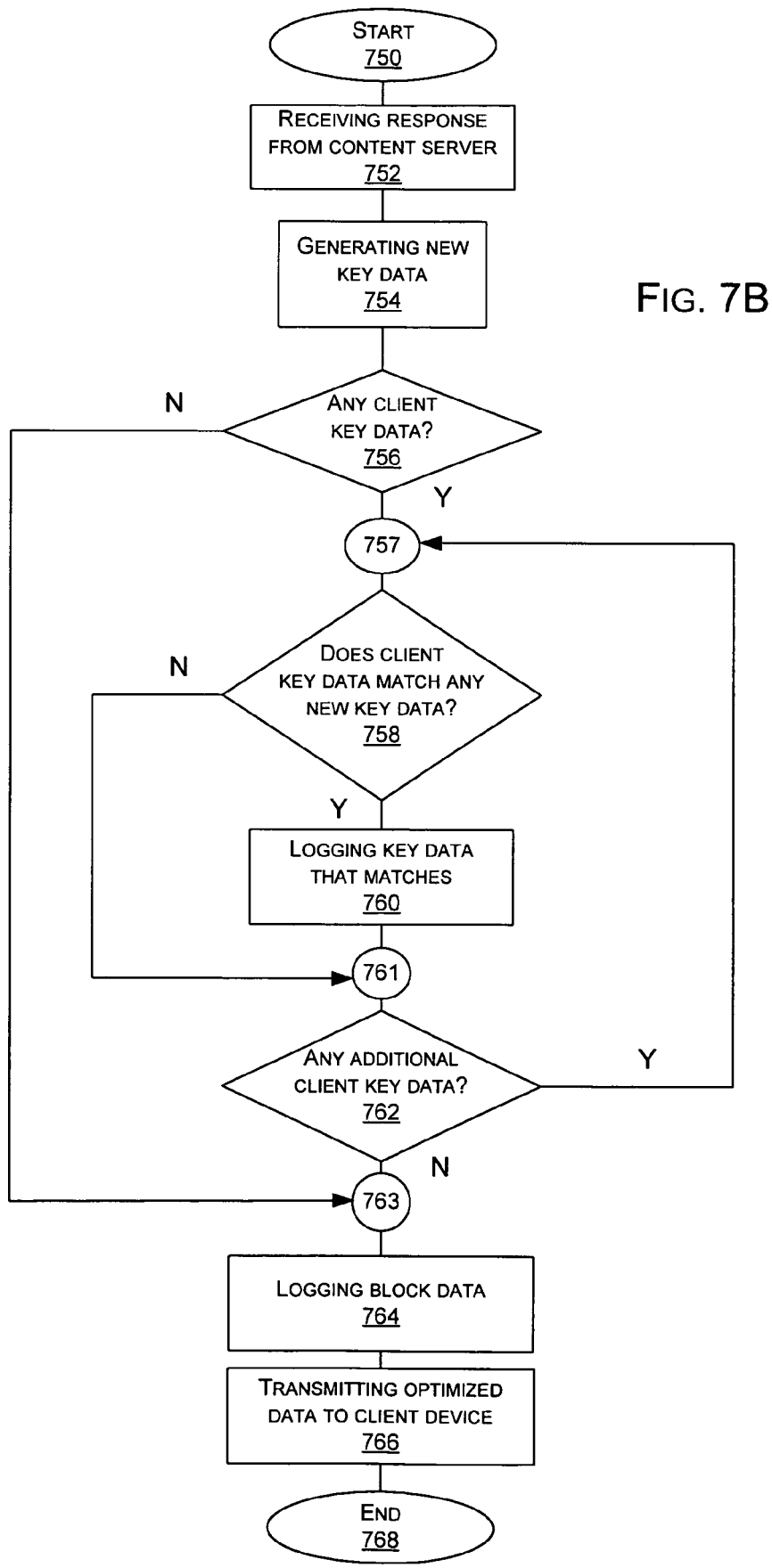

FIGS. 7A and 7B are flowcharts representing exemplary methods for providing delta compression at an OS. Referring to FIG. 7A, it will be readily appreciated by one of ordinary skill in the art that the illustrated procedure can be altered to delete steps or further include additional steps. After initial start step 700, OS receives (702) a request from a client device, e.g. client device 104. The request may include an HTTP request and/or client key data.

After the OS has received the request, the OS can determine (704) whether the request includes any client key data. If the request does not include any client key data, the OS can forward (710) the request to a content server for processing. On the other hand, if the request includes client key data, the OS can extract (712) the request from the client key data and provide (714) the client key data for matching, e.g. for matching at comparator 246. Then the OS can forward (716) the extracted request (e.g. HTTP request) to content server. In some embodiments, the forwarding step can precede the providing step 714. After either one of the forwarding steps 710 or 716, the method can end (718).

Referring to FIG. 7B, it will be readily appreciated by one of ordinary skill in the art that the illustrated procedure can be altered to delete steps or further include additional steps. After initial start step 750, an OS receives (752) a response from content server.

After the OS receives the response, the OS can generate (754) new key data. This new key data is created by breaking down the response data into smaller portions called block data. Once this block data is broken down, a key is assigned to each block data so that key data can represent block data from the response. For example, the key data can be a hash value for the block data.

OS can determine (756) whether it was provided with any client key data. If the OS was not provided any client key data, the method can proceed to connector 763 and then to logging step 764. On the other hand, if the OS was provided with client key data, the method can proceed to connector 757 and then to determination step 758. In some embodiments, the determination step 756 can precede the receiving step 752 or the generation step 754.

After the new keys have been generated, the OS determines (758) whether the current client key data matches any of the new key data. For example, the OS performs the matching by comparing the first client key data C1 with the new key data until a match has been determined or until C1 has been compared to all of the new key data and a match does not exist. Then, the OS could attempt to match C2 with the new key data and so on until determining the final client key data CN. In some embodiments, certain client key data may not exist (e.g. C3 so that the client key data includes C1, C2, C4 . . . ) and the method can proceed as if non-existing key data existed or can skip comparing the non-existing client key data with the new key data to the next available client key data C4. Alternatively, in some embodiments, the OS can compare each new key data with the entire set of client key data. If the OS determines that the current client key data does not match any new key data, the method can proceed to connector 761 and to determination step 762. On the other hand, if the OS determines that the current client key data matches one of the new key data, the OS logs (760) the client key data that matches the new key data. Additionally, the OS can delete the block data associated with the matched new key data.

The method proceeds to connector 761 and then determines (762) whether any additional client key data needs to be matched so that the method can determine if the last client key data has been reviewed or if the OS shall continue to attempt to match. If additional client key data needs to be matched, then the method proceeds to connector 757 and the OS shall attempt to match subsequent client key data. On the other hand, if there is no additional client key data that needs to be matched, then the method can proceed through connector 763 and the OS can log (764) the non-matched block data associated with the non-matched new key data. In some embodiments, if the client key data matches all of the new key data, then non-matched block data is not logged.

After the OS has logged the relevant data, the OS has the ability to transmit (766) optimized data to the client device. The optimized data may include matched key data and/or non-matched block data. After the transmitting step, the method can end (768).

The methods disclosed herein may be implemented as a computer program product, i.e., a computer program tangibly embodied in an information carrier, e.g., in a machine readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand alone program or as a module, component, subroutine, or other unit suitable for use in a computing environment. A computer program can be deployed to be executed on one computer or on multiple computers at one site or distributed across multiple sites and interconnected by a communication network.

In the preceding specification, the invention has been described with reference to specific exemplary embodiments. It will however, be evident that various modifications and changes may be made without departing from the broader spirit and scope of the invention as set forth in the claims that follow. The specification and drawings are accordingly to be regarded as illustrative rather than restrictive sense. Other embodiments of the invention may be apparent to those skilled in the art from consideration of the specification and practice of the invention disclosed herein.

What is claimed is:

1. A method comprising:
   receiving at an optimization server a request for content data along with stored keys from a client terminal having a user agent, wherein the content data corresponds to one or more stored blocks being represented by stored keys that are generated using a first block encoding method, each stored key representing a stored block at the client terminal, and wherein the stored keys are provided based on a key lookup using the request;
   communicating with a content server, wherein the communication includes transmitting the request to the content server and receiving the content data;
   breaking the content data into one or more new blocks;
   generating new keys representing the one or more new blocks using a second block encoding method that is similar to the first block encoding method, wherein each new block is represented by a new key;
   comparing the new keys with the stored keys for determining matching and non-matching keys;
   storing the determined matching keys in a match list;
   storing one or more new blocks corresponding to the determined non-matching keys in a no-match list; and
   transmitting to the client terminal the determined matching keys stored in the match list and the one or more new blocks stored in the no-match list, wherein the one or more new blocks and stored blocks corresponding to the determined matching keys are organized before being submitted to the user agent.

2. The method of claim 1, wherein receiving the request from the user agent includes performing a key lookup for the request to determine if one or more of the stored keys exist.

3. The method of claim 1, further comprising:
performing a block data lookup by retrieving stored blocks that correspond to the matching keys;
providing, to the user agent, the transmitted one or more new blocks and the stored blocks that correspond to the matching keys.

4. A method comprising:
receiving at a client terminal request data from a user agent;
performing a key lookup based on the request data;
providing first key data based on the key lookup, wherein the first key data is generated using a first block encoding method and represents stored block data corresponding to the requested content data;
communicating with an optimization server, wherein the communicating includes transmitting the request data to the optimization server and receiving response data associated with the request data;
receiving optimized data from the optimization server, wherein the optimized data is generated by breaking received response data into one or more new blocks, generating second key data representing the one or more new blocks using a second block encoding method that is similar to the first block encoding method, comparing the second key data with the first key data for determining matching and non-matching keys, storing the determined matching keys in a match list, storing one or more new blocks corresponding to the determined non-matching keys in a no-match list, and including into the optimized data the determined matching keys stored in the match list and the one or more new blocks stored in the no-match list
providing a buffer with stored block data corresponding to the determined matching keys included in the optimized data; and
transmitting the buffered block data to the user agent.

5. The method of claim 4, wherein providing block data to the buffer includes providing stored block data.

6. The method of claim 4, wherein providing block data to the buffer includes providing second block data associated with the second key data if the second key data does not match the first key data.

7. A system comprising:
a client terminal configured to receive a first request data from a user agent, perform a first key data lookup that determines whether any first key data relating to the first request data exists, and transmit second request data that includes the first request data and the existing first key data, wherein the first key data is generated using a first block encoding method and represent stored bock data at the client terminal; and
a server configured to receive the second request data, determine whether the second request data includes the existing first key data, forward the second request data to a content server based on the determination, receive response data that is associated with the second request data, break the response data into one or more new blocks, generate second key data representing the one or more new blocks using a second block encoding method that is similar to the first block encoding method, compare the second key data with the existing first key data for determining matching and non-matching keys, store the determined matching keys in a match list, store new blocks corresponding to the determined non-matching keys in a no-match list, and transmit optimized data to the client terminal, wherein the optimized data includes the matching keys stored in the match list and the new blocks stored in the no-match list, and
wherein the client terminal receives the optimized data, organizes block data corresponding to the matching keys included in the optimized data and the new blocks included in the optimized data, and transmits to the user agent the organized block data.

8. A non-transitory computer-readable storage medium including instructions that, when executed, causes a computer processor to perform a method for data compression, the method comprising:
receiving at a client terminal a first request data from a user agent;
performing a key lookup for the first request data to determine if any first key data exists, wherein the first key data is generated using a first block encoding method and represents stored block data corresponding to the requested content data;
transmitting a second request data that includes the first request data and the existing first key data;
receiving optimized data that is associated with the second request data, wherein the optimized data provides block data corresponding to the second request data, and wherein the optimized data is generated by breaking received response data into one or more new blocks, generating second key data representing the one or more new blocks using a second block encoding method that is similar to the first block encoding method, comparing the second key data with the first key data for determining matching and non-matching keys, storing the determined matching keys in a match list, storing new blocks corresponding to the determined non-matching keys in a no-match list, and including into the optimized data the determined matching keys stored in the match list and the one or more new blocks stored in the no-match list;
organizing stored block data corresponding to the matching keys included in the optimized data and the new blocks included in the optimized data; and
transmitting the organized block data to the user agent.

9. The non-transitory computer-readable storage medium of claim 8, wherein the optimized data includes first key data referencing stored block data and the buffered block data includes the stored block data.

10. The non-transitory computer-readable storage medium of claim 8, wherein the optimized data includes non-matching block data and the buffered block data includes the non-matching block data.

11. A non-transitory computer-readable storage medium including instructions that, when executed, causes a computer processor to perform a method for data compression, the method comprising:
receiving at an optimization server request data from a client device having a user agent;
determining whether the request data includes first key data, wherein the first key data is generated using a first block encoding method and represents blocks of data, stored on the client device, corresponding to requested content data, and wherein the first key data is provided based on a key lookup at the client device using the request data;
forwarding the request data to a content server based on the determination;
receiving response data that is associated with the request data;
breaking the response data into one or more new blocks;
generating second key data representing the one or more new blocks using a second block encoding method that is similar to the first block encoding method;

comparing the second key data with the first key data for determining matching and non-matching keys;
storing the determined matching keys to a match list;
storing one or more new blocks corresponding to the non-matching keys to a no-match list; and
transmitting to the client device the determined matching keys stored in the match list and the one or more new blocks stored in the no-match list, wherein the one or more new blocks and stored blocks of data corresponding to the determined matching keys are organized before being submitted to the user agent.

12. The non-transitory computer-readable storage medium of claim 11, wherein forwarding the request data includes extracting the first key data from the request data and forwarding the resultant request data to the content server when the request data includes first key data.

13. The non-transitory computer-readable storage medium of claim 11 further comprising comparing the first key data with the second key data when the request data includes the first key data.

* * * * *